United States Patent
Fastow et al.

(10) Patent No.: US 6,950,344 B1
(45) Date of Patent: Sep. 27, 2005

(54) READING FLASH MEMORY

(75) Inventors: Richard M. Fastow, Cupertino, CA (US); Xin Guo, Mountain View, CA (US); Sheung-Hee Park, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/721,643

(22) Filed: Nov. 24, 2003

(51) Int. Cl.[7] .............................................. G11C 16/06
(52) U.S. Cl. ........................ 365/185.22; 365/185.18; 365/185.19; 365/185.29; 365/185.33
(58) Field of Search ....................... 365/185.22, 185.18, 365/185.19, 185.29, 185.33, 185.26

(56) References Cited

U.S. PATENT DOCUMENTS 6,525,969 B1 * 2/2003 Kurihara et al. ....... 365/185.29
6,529,398 B1 * 3/2003 Nair et al. .................. 365/145

* cited by examiner

Primary Examiner—Van Thu Nguyen
Assistant Examiner—Pho M. Luu

(57) ABSTRACT

A method and system for reading flash memory. A leakage current of a common bit line comprising the flash memory cell is accessed. A read current of the flash memory cell is accessed. The leakage current is eliminated from the read current to determine a cell current. The cell current is compared to an erase verify cell current. The currents may be directly subtracted, or they may be converted to corresponding voltages and the voltages subtracted. Advantageously, cells may be correctly verified for erasure without a preliminary search and recovery of over erased bits. As a beneficial result, the search and recovery of over erased bits does not need to be performed during an erase process. Advantageously, such steps may be eliminated from an erase process, recovering the time otherwise required to perform such steps, and thereby speeding up the erase process.

18 Claims, 4 Drawing Sheets

READING FLASH MEMORY

TECHNICAL FIELD

Embodiments of the present invention relate to design and operation of sub-micron metal oxide semiconductors. More particularly, embodiments of the present invention provide a system and method for reading flash memory.

BACKGROUND ART

Flash memory is a type of semiconductor computer memory with many desirable characteristics. Like read only memory, ROM, it is non-volatile, meaning that the contents of the memory are stable and retained without applied electrical power.

Flash memory devices have found wide commercial success in the electronic device market. A major advantage of flash over ROM is that the memory contents of flash may be changed after the device is manufactured. Flash memory has found wide acceptance in many types of computers, including desktop computers, mobile phones and hand held computers. Flash memory is also widely used in digital cameras and portable digital music players, for example "MP3" players.

In addition to direct flash storage applications, for example in video cameras, flash-based storage devices are replacing rotating magnetic disks, sometimes known as hard drives, in many applications. Compared to hard drives, flash is significantly more rugged, quieter, lower power, and for some densities such a flash based device may be smaller than a comparable hard drive.

A flash memory typically comprises an array of cells that can be independently programmed and read. The size of each cell and thereby the memory as a whole are made smaller by eliminating the independent nature of each of the cells. As such, all of the cells are erased together as a block.

A memory of this type includes individual-Metal-Oxide Semiconductor (MOS) memory cells that are field effect transistors (FETs). Each FET, or flash memory cell includes a source, drain, floating gate or nitride storage layer and control gate to which various voltages are applied to program the cell with a binary 1 or 0, or erase all of the cells as a block. Programming occurs by hot electron injection in order to add charge to the floating gate or nitride layer. Erasure employs Fowler-Nordneim tunneling effects in which electrons punch through a thin dielectric layer, thereby reducing the amount of charge on the floating gate or nitride layer. Erasing a cell typically sets the logical value of the cell to "1," while programming a cell sets the logical value to "0." The flash memory cell provides for nonvolatile data storage.

FIG. 1 shows a memory cell 10 as has been well known in the conventional art. Region 14 is the source region for memory cell 10, and is typically created by implantation of dopant materials, for example N-type (or n+) dopants. Region 15 is the drain of cell 10, and is created by similar processes to source 14. In many memory cells, regions 14 and 15 are constructed substantially similarly, and either region may be used as source and/or drain interchangeably. Control gate 16 is used to control the operation of memory cell 10. A p-well region 17 is formed between source/drain regions 14. Feature size 18 is the nominal size of the smallest feature that can be created by a particular semiconductor process. In memory cells of this type, the gate 16 width and channel 17 length typically correspond approximately to feature size 18.

Memory cell 10 may be one of two general types of non-volatile memory, a "floating gate" cell or a nitride read only memory (NROM) cell. In a floating gate cell, layer 12B of the gate stack is typically conductive polysilicon. Layers 12A and 12C are insulating materials which isolate or "float" gate layer 12B, which is usually referred to as a floating gate. Floating gate 12B is the storage element of memory cell 10.

Silicon nitride based flash memory has many advantages as compared to its floating gate and tunneling oxide based counterparts. Silicon-Oxide-Nitride-Oxide-Silicon (SONOS) is potentially very dense in terms of number of cells per unit area that can be used and it requires fewer process steps as compared to floating gate memory. Moreover, it can be easily integrated with standard SRAM process technology. A further advantage of using SONOS devices is their suitability for applications requiring large temperature variations and radiation hardening. The SONOS stack is a gate dielectric stack and consists of a single layer of polysilicon, a triple stack ONO (Oxide-Nitride-Oxide) gate dielectric layer and a MOS channel 17. The ONO structure may consist of a tunnel oxide 12A, a nitride memory storage layer 12B and a blocking oxide layer 12C.

To read a bit stored in memory cell 10, the control gate 16 is brought to a read voltage of about 4 volts and the source 14 is grounded. Any charge present on storage layer 12B influences the amount of current flowing through the device, e.g., from source 14 to drain 15. Sensing logic connected to a bit line comprising the cell compares the magnitude of the current flowing in memory cell 10 to the current of a read reference cell in order to determine if a bit is stored in memory cell 10. E.g., if a current flowing in reference cell 10 is greater than a current of a read reference cell, memory cell 10 is said to be programmed, and the cell is read as a binary "0."

To write (or program) a bit into memory cell 10, control gate 16 is brought to a programming voltage of about 9 volts, the drain 14 is brought to a voltage of about 5.0 volts, and source 15 is grounded. The resulting current flow causes hot carrier injection of charge into storage layer 12B. A programming operation is typically followed by a "program verify" operation which performs a read of the programmed bits to ensure that they were completely and properly programmed.

To erase memory cell 10, a voltage of about −9 volts is applied to control gate 16. P-well region 17 has about +9 volts applied. In response to the applied voltage, charge migrates off of storage layer 12B via Fowler-Nordheim tunneling. These voltages are typically applied in the form of a pulse, or series of pulses, known as an erase pulse. A typical erase pulse may be approximately within the range of 0.1 ms to 10 ms in duration.

Following an erase pulse, an "erase verify" operation is performed. An erase verify operation is similar to a read verify operation in that each cell in an "erased" sector is read to verify that the cell is completely and thoroughly erased. For an erase verify operation, rather than a read reference cell, a special erase reference cell, which is typically at a slightly lower voltage than a read reference cell, is used in a current comparison operation.

If an erase verify operation determines that one or more cells are not erased, then another erase pulse is generated. A sequence of erase pulses followed by erase verify operations typically continues until all cells verify as erased. A typical erase time for a sector of flash memory cells is about 100 ms.

FIG. 2 illustrates a typical configuration of a plan view of a section of a memory array 100 in a NOR-type of configuration for a memory device. FIG. 2 is not drawn to scale. As shown in FIG. 2, the array 100 is comprised of rows 110 and columns 120 of memory cells. Each of the memory cells is isolated from other memory cells by insulating layers (e.g., a plurality of shallow trench isolation regions (STI) 150).

The control gates of each of the memory cells are coupled together in each of the plurality of rows 110 of memory cells, and form a plurality of word lines 130 that extend along the row direction.

Bit lines extend in the column direction and are coupled to drain regions via drain contacts 168 in an associated column of memory cells 120. The bit lines are coupled to drain regions of memory cells in associated columns of memory cells 120.

A plurality of source lines 140 extend in the row direction and are coupled to the source regions of each of the memory cells in the array of memory cells 100. One source line is coupled to source regions in adjoining rows of memory cells, and as a result, one source region is shared between two memory cells. Similarly, drain regions are shared amongst adjoining rows of memory cells, and as a result, one drain region is shared between two memory cells.

A plurality of source contacts are coupled to the plurality of common source lines 140. Each of the plurality of source contacts 145 is formed in line with the associated common source line to which it is coupled. The source contacts are formed in a column 160, and may be coupled with each other. The column 160 is isolated between two STI regions and forms a dead zone in which no memory cells are present.

It is to be appreciated that due to the NOR architecture of array 100, numerous drains are coupled together to form a bit line. For example, 512 cells may be attached to a common bit line. Unfortunately, if a single cell becomes leaky, e.g., it has been "over erased" and the cell has entered a depletion mode of operation, that cell will conduct high levels of current, even when that cell is not being directly accessed. A single such over erased cell may cause all cells coupled to the same common bit line as the over erased cell to appear to be erased. For example, during a read or erase verify operation, a cell that has not been erased may falsely appear to actually be erased as a result of current flowing on a common bit line from an over erased cell.

A conventional approach to mitigate false erase verifies due to over erased cells is to recover over erased cells. For example, after every erase pulse, and prior to an erase verify operation, a search is performed to detect leaky columns, which may contain over erased cells. For example, a modified read operation with approximately 0 volts applied to the word line may be performed. If a bit line is determined to contain a leaky cell, a recovery operation is performed.

A recovery operation may comprise applying approximately +5 volts to the drain of the bit line, approximately 0 volts on the source of the drain line and approximately 0 volts on the gate. The application of these voltages is designed to "soft" or partially program a leaky cell. Each column containing an over erased cell may take from about 100 µs to 1 ms of such applied voltages to correct the over erasure.

Flash memory generally must be erased, either in its entirety or in large segments called pages, prior to changing its contents. Erasing a flash device, or a portion of a flash device, is generally a long process, typically measured in hundreds of milliseconds. This is a disadvantage compared to RAM and hard drives, which may be written directly, without an interposing erasure. Unfortunately, having to insert additional steps, for example, searching for and recovering over erased cells, into the basic erase cycle detrimentally increases the time required to erase flash memory.

Semiconductor processing equipment is extremely expensive. Fundamental semiconductor processing steps, e.g., implantation and diffusion, typically require long periods of development and extensive qualification testing. Implementing a new fabrication process requires considerable resources on the part of the semiconductor manufacturer. A manufacturer may have to alter or entirely revamp process libraries and process flows in order to implement a new fabrication process. Additionally, re-tooling a fabrication line is very expensive, both in terms of direct expenses as well as in terms of opportunity cost due to the time required to perform the re-tooling. Consequently, any solution to increase the rate of flash programming should be compatible with existing semiconductor processes and equipment without the need for revamping well established tools and techniques.

Accordingly, a need exists to increase the erase speed of flash memory. A further need exists for increasing the erase speed of flash memory in a manner that is compatible and complimentary with conventional approaches to increase the programming speed of flash memory. A still further need exists for the above mentioned needs to be achieved with existing semiconductor processes and equipment without revamping well established tools and techniques.

DISCLOSURE OF THE INVENTION

Embodiments of the present invention provide a means to increase the erase speed of flash memory. Further embodiments of the present invention provide for increasing the erase speed of flash memory in a manner that is compatible and complimentary with conventional approaches to increase the erase speed of flash memory. Still further embodiments of the present invention provide for the above mentioned solutions to be achieved with existing semiconductor processes and equipment without revamping well established tools and techniques.

A method and system for reading flash memory is disclosed. A leakage current of a common bit line comprising the flash memory cell is accessed. A read current of the flash memory cell is accessed. The leakage current is eliminated from the read current to determine a cell current. The cell current is compared to an erase verify cell current The currents may be directly subtracted, or they may be converted to corresponding voltages and the voltages subtracted. Advantageously, cells may be correctly verified for erasure without a preliminary search and recovery of over erased bits. As a beneficial result, the search and recovery of over erased bits does not need to be performed during an erase process. Advantageously, such steps may be eliminated from an erase process, recovering the time otherwise required to perform such steps, and thereby speeding up the erase process.

BEST MODE FOR CARRYING OUT THE INVENTION

In the following detailed description of the present invention, reading flash memory, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail so as not to unnecessarily obscure aspects of the present invention.

READING FLASH MEMORY

Embodiments of the present invention are described in the context of design and operation of flash memory devices. However, it is appreciated that embodiments of the present invention may be utilized in other areas of electronic design and operation.

Figure 1:
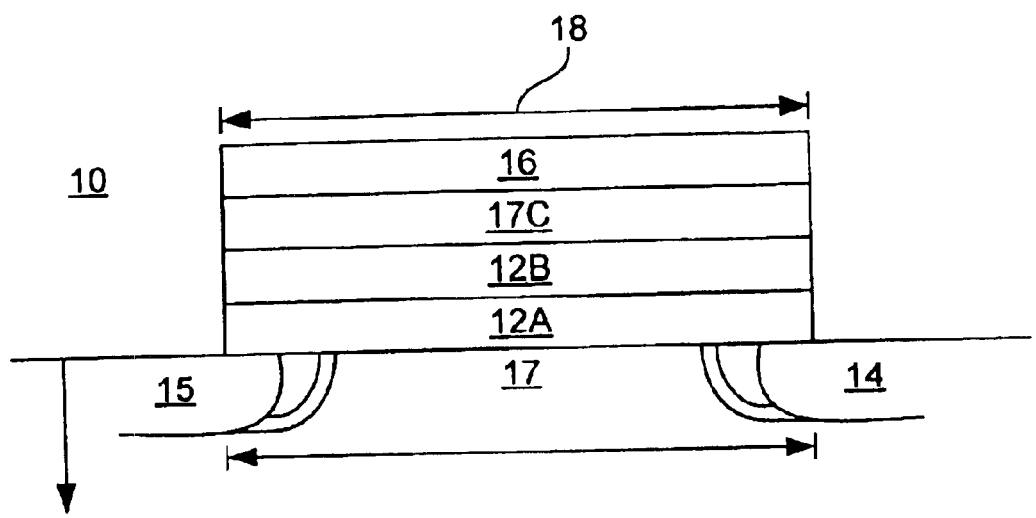
FIG. 1 shows a memory cell as has been well known in the conventional art.
Figure 2:
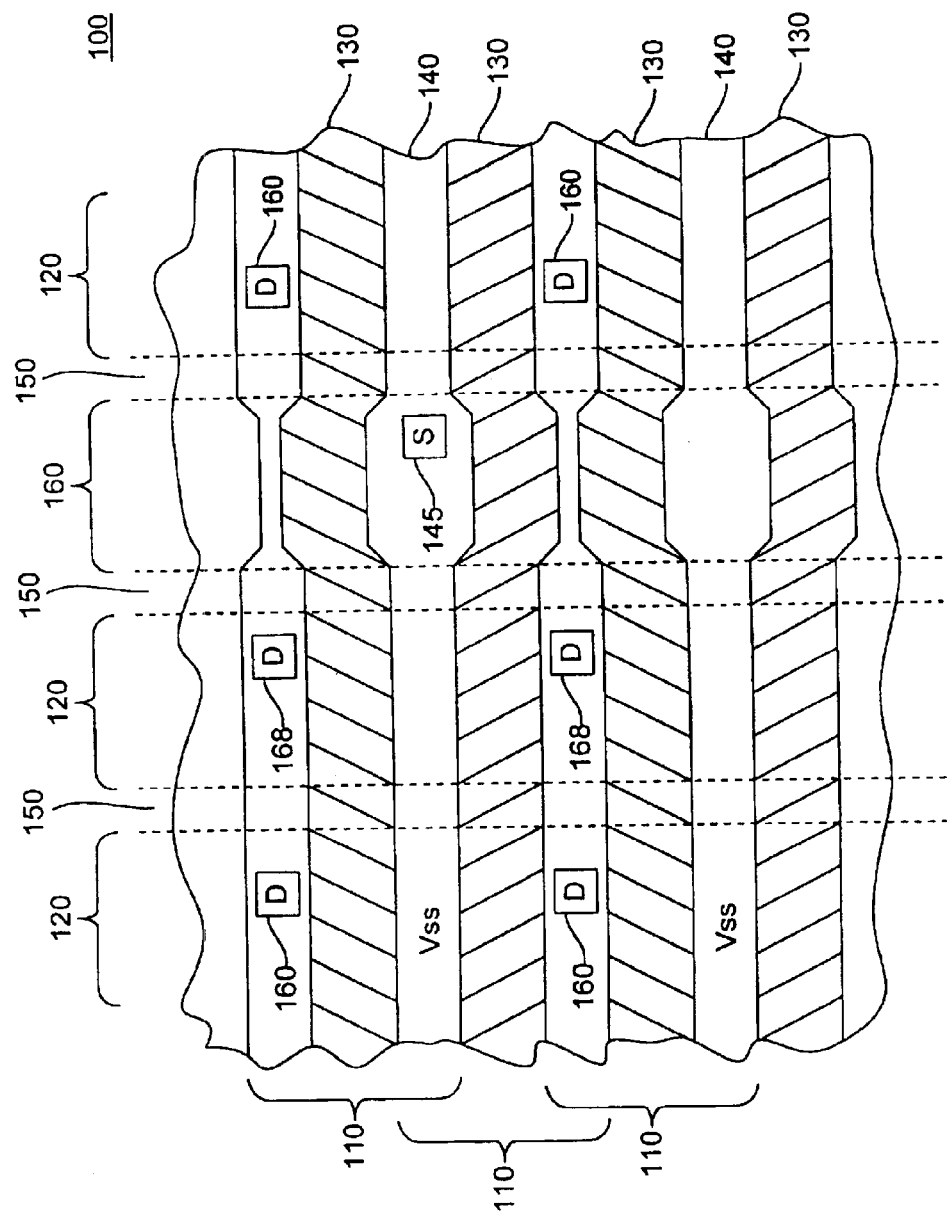
FIG. 2 illustrates an array of non-volatile memory cells.
Figure 3:
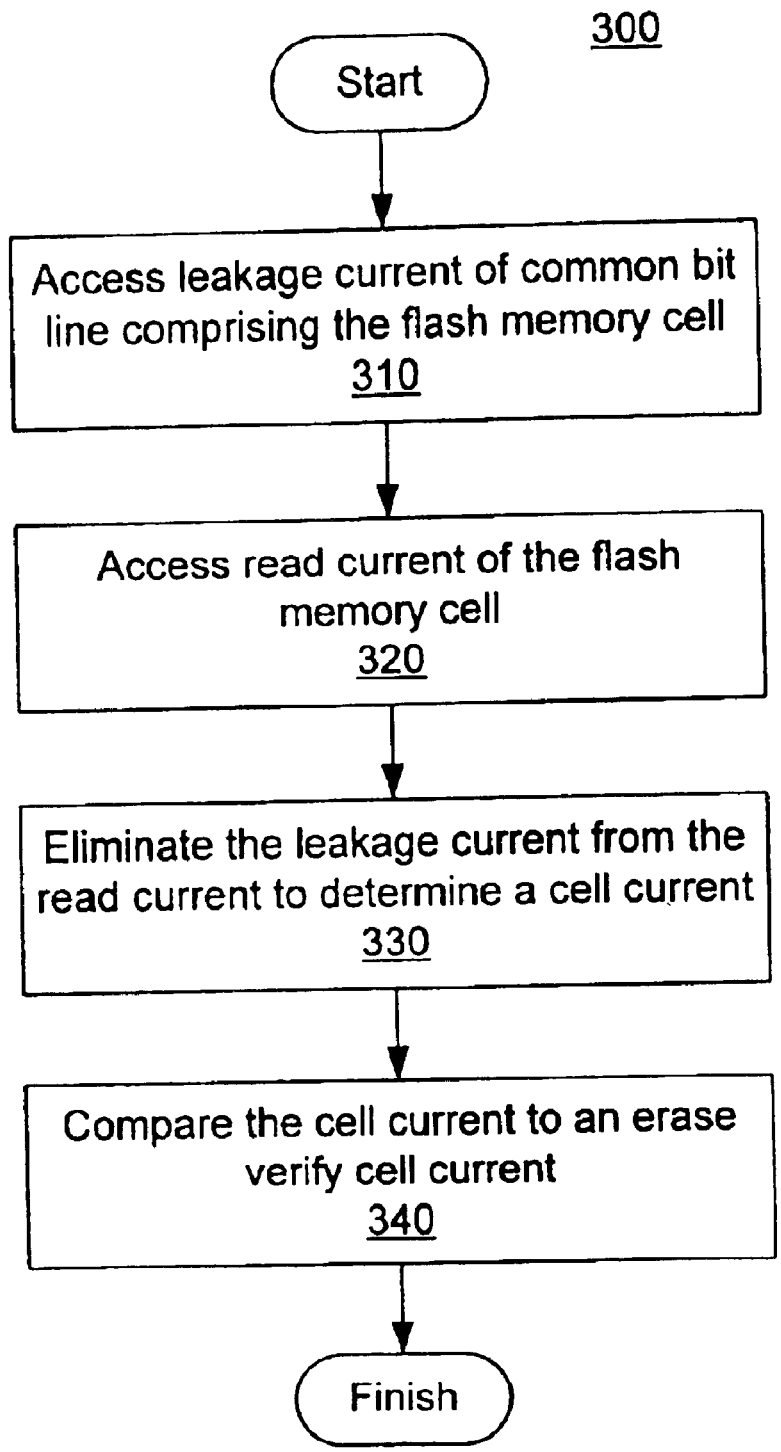
FIG. 3 illustrates a method of verifying erasure of a flash memory, according to an embodiment of the present invention.

FIG. 3 illustrates a method 300 of verifying erasure of a flash memory, according to an embodiment of the present invention. In step 310, a leakage current of a common bit line comprising a flash memory cell is accessed. For example, referring to the illustration of memory cell 10 in FIG. 1, the control gate 16 is brought to a read voltage of about 0 volts and the source 14 is grounded. It is appreciated that a conventional read or erase verify operation on memory cell 10 applies a substantially higher voltage, for example 4 volts, to control gate 16. An over erased cell will typically cause excessive current to flow under this condition. It is to be appreciated that current flow due to an over erased cell is problematic, and may typically cause an erase verify operation to falsely determine that cells sharing a common bit line are erased.

In step 320, a read current of the flash memory cell is accessed. This step may be similar to a conventional read or erase verify operation. For example, referring to the illustration of memory cell 10 in FIG. 1, the control gate 16 is brought to a read voltage of about 4 volts and the source 14 is grounded. A charge present (or absent) on storage layer 12B influences the amount of current flowing through the device, e.g., from source 14 to drain 15. It is to be appreciated that the conventional step in a read operation of comparing the cell current to the current of a read (or erase verify) reference cell may be omitted from step 320.

In step 330, the leakage current is eliminated from the read current to determine a cell current. It is to be appreciated that due to the parallel nature of the NOR memory architecture, current is not accessed directly at a memory cell, e.g., memory cell 10, but rather along a bit line comprising a plurality of cells. Consequently, an accessed current may be made up of contributions from origins other than a particular cell being read. For example, the current flowing in a bit line is comprised of a current contribution from a particular cell being directly read, and a current contribution from one or more leaky cells on the same bit line.

Eliminating the leakage current from the read current may be performed in a wide variety of well known processes, according to embodiments of the present invention. For example, one current could be mirrored and reversed and then added to the other current. Alternatively, the currents may be converted into corresponding voltages, e.g., across a transconductance, and the voltages summed. Embodiments of the present invention are further well suited to conversion of currents and/or voltages into a digital domain, and then being subjected to various well known numerical means of eliminating one current from another.

In step 340, the cell current is compared to an erase verify cell current. It is appreciated that step 340 is similar to a portion of a conventional erase verify step. It is to be appreciated that, according to an embodiment of the present invention, the current being compared with the erase verify cell current is not the same as the current read directly from the cell in a conventional read configuration. It is to be appreciated that embodiments of the present invention are well suited to a re-ordering of steps 310 and 320. Generally, embodiments of the present invention should have a means for storing at least one of the currents, or storing representations thereof. Because a leakage current and a read current are generally determined exclusively of one another, both currents are generally not available at the same time. Hence, current, or a representation of current, storage means should be provided. The sequence of steps 310 and 320 should be determined by optimizations outside of the scope of the present invention.

In this novel manner, cells may be correctly verified for erasure without a preliminary search and recovery of over erased bits. As a beneficial result, the search and recovery of over erased bits does not need to be performed during an erase process. Advantageously, such steps may be eliminated from an erase process, recovering the time otherwise required to perform such steps, and thereby speeding up the erase process. It is to be appreciated that the time required to access a leakage current will generally be several orders of magnitude less than the time required to search for, and recover over erased cells.

In addition, it is to be appreciated that embodiments of the present invention can mitigate detrimental effects of over erased cells during a read operation. Due to extra current flowing through an over erased cell, read operations may falsely determine that a cell is erased. As data integrity is highly prized, embodiments of the present invention may be beneficially applied outside of an erase cycle, for example in "normal" reads or in a data recover operation.

Figure 4:
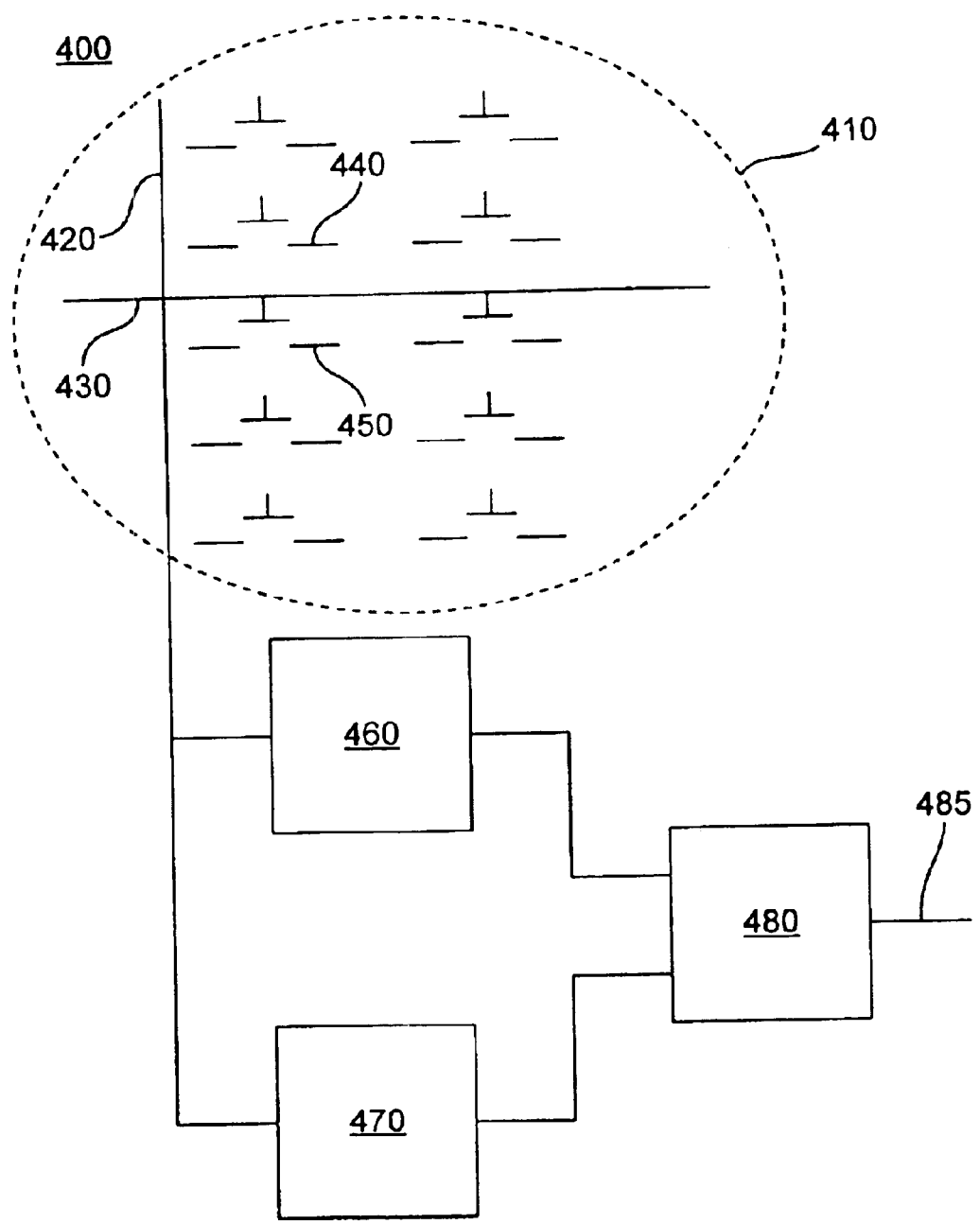
FIG. 4 illustrates a portion of an integrated circuit device, according to an embodiment of the present invention.

FIG. 4 illustrates a portion 400 of an integrated circuit device, according to an embodiment of the present invention. Portion 400 comprises an array 410 of flash memory cells. Each cell may be similar to flash memory cell 10 of FIG. 1. The cells, e.g., cells 440 and 450, are arranged with a common bit line 420 and a word line 430 for cell 450. Generally, common word line 430 couples a plurality of cell gates together, while common bit line 420 couples a plurality of cell drain regions together. It is to be appreciated that typically such an array comprises many more bit lines and word lines. Such additional lines are not included herein so as to better illustrate embodiments of the present invention.

Integrated circuit device portion 400 further comprises circuitry 470 for accessing a read current of a flash memory cell, for example flash memory cell 450. Read current of cell 450 is accessed via common bit line 420. It is to be appreciated that if flash memory cell 440 is conducting current, e.g., as a result of being over erased, the current of cell 440 will also be present on common bit line 420. Conventionally, such an extra current may deleteriously interfere with the function of circuitry 470 or a subsequent comparison with a read or erase verify reference cell (not shown). As previously described, circuitry 470 may access a read current in a well known manner.

Circuitry 460 accesses a leakage current of a common bit line, for example common bit line 420. For example, word lines of cells on common bit line 420 are set to zero volts, and sources of those cells are grounded. In response to such configuration, any over erased cells, e.g., cell 440, will conduct current on to common bit line 420.

It is to be appreciated that embodiments of the present invention should have a means for storing at least one of the currents, or storing representations thereof. Because a leakage current and a read current are generally determined exclusively of one another, both currents are generally not available at the same time. Hence, current, or a representation of current, storage means should be provided. If such storage means are a part of circuitry 480 (to be described in greater detail below), then circuitry 460 and 470 may be of conventional design. Embodiments of the present invention are well suited to current storage means located in circuitry 480, or circuitry 460 and 470, or combinations thereof.

It is to be appreciated that circuitry 460 and 470 are generally configured so as to be selectively coupled to a plurality of bit lines of a memory array, so as to access all bit lines of an array.

Integrated circuit device portion 400 further comprises circuitry 480 for eliminating a leakage current from a read current to determine a cell current 485. Circuitry 480 may be implemented in a wide variety of well known configurations, according to embodiments of the present invention. For example, one current could be mirrored and reversed and then added to the other current. Alternatively, the currents may be converted into corresponding voltages, e.g., across a transconductance, and the voltages summed. Embodiments of the present invention are further well suited to conversion of currents and/or voltages into a digital domain, and then being subjected to various well known numerical means of eliminating one current from another.

The well known Moore's Law of the semiconductor field states that the number of semiconductor devices, e.g., transistors, per unit area will double every 18–24 months. While other factors such as design improvements contribute, one of the fundamental drivers of this inexorable density increase is the ever shrinking minimum feature size of semiconductors. For example, a common minimum feature size of modern semiconductors is 0.11 microns.

Further advantages of embodiments of the present invention are realized as minimum feature sizes continue to decrease. Cell size generally decreases as the square of the feature size reduction. As cells become smaller, they are more likely to be over erased. Consequently, under the conventional art, as cell size decreases erase time will increase due to the more frequent occurrence of over erased cells, and the undesirable commensurate time spent in search and recovery operations. Embodiments of the present invention do not require such expenditures of valuable time.

In addition, because embodiments of the present invention mitigate the effects of over erasure, erase distributions may be tightened and the difference between erase voltage thresholds and programmed voltage thresholds may be lessened. It is to be appreciated that read, erase and program thresholds are typically designed to provide some guard band allowing for leaky cells. Tightening the distributions and/or reducing threshold voltages associated with programmed and erased states, e.g., less than about 2.5 volts for an erase threshold, is synergistic with smaller feature sizes. For example, smaller feature sizes typically lead to shorter channel lengths, which in turn leads to lower threshold voltages. Embodiments of the present invention enable memory cell designers to fully utilize numerous benefits of on-going improvements in the semiconductor arts.

Embodiments of the present invention provide a means to increase the erase speed of flash memory. Further embodiments of the present invention provide for increasing the erase speed of flash memory in a manner that is compatible and complimentary with conventional approaches to increase the erase speed of flash memory. Still further embodiments of the present invention provide for the above mentioned solutions to be achieved with existing semiconductor processes and equipment without revamping well established tools and techniques.

The preferred embodiment of the present invention, reading flash memory, is thus described. While the present invention has been described in particular embodiments, it should be appreciated that the present invention should not be construed as limited by such embodiments, but rather construed according to the below claims.

What is claimed is:

1. A method for reading a flash memory cell comprising:
   accessing leakage current of a common bit line comprising said flash memory cell;
   accessing read current of said flash memory cell;
   eliminating said leakage current from said read current to determine a cell current;
   comparing said cell current to a verify cell current; and
   wherein said verify cell is an erase verify cell.

2. The method as described in claim 1 wherein said flash memory cell comprises a floating gate as a storage element.

3. The method as described in claim 1 wherein said flash memory cell comprises a nitride layer as a storage element.

4. A method for reading a flash memory cell comprising:
   accessing leakage current of a common bit line comprising said flash memory cell;
   accessing read current of said flash memory cell;
   eliminating said leakage current from said read current to determine a cell current;
   comparing said cell current to a verify cell current; and
   wherein said accessing leakage current comprises configuring said flash memory cell for a read operation with a control gate voltage at approximately zero volts.

5. The method as described in claim 4 wherein said control gate is an element of said common word line.

6. The method as described in claim 4 wherein said eliminating said leakage current from said read current comprises subtracting a voltage corresponding to said read current from a voltage corresponding to said leakage current.

7. The method as described in claim 6 wherein said voltage corresponding to said leakage current is stored on a capacitive element.

8. A method of erasing a sector of flash memory comprising:
   applying an erase pulse to said sector of flash memory;
   performing a method for verifying erasure of each flash memory cell in said sector of flash memory, said method comprising:
     accessing leakage current of a common bit line comprising said flash memory cell;
     accessing read current of said flash memory cell;
     eliminating said leakage current from said read current to determine a cell current;
     comparing said cell current to an erase verify cell current; and
   repeating said applying an erase pulse if said cell current is greater than said erase verify cell current.

9. The method as described in claim 8 wherein said accessing leakage current comprises configuring said flash memory cell for a read operation with a control gate voltage at approximately zero volts.

10. The method as described in claim 8 wherein said eliminating said leakage current from said read current comprises subtracting a voltage corresponding to said read current from a voltage corresponding to said leakage current.

11. The method as described in claim 10 wherein said voltage corresponding to said leakage current is stored on a capacitive element.

12. The method as described in claim 8 wherein said flash memory cell comprises a floating gate as a storage element.

13. The method as described in claim 8 wherein said flash memory cell comprises a nitride layer as a storage element.

14. An integrated circuit device comprising:

an array of flash memory cells, said cells arranged with at least one common word line and at least one common bit line;

first circuitry for accessing a leakage current of said common bit line, coupled to said common bit line;

second circuitry for accessing a read current of a flash memory cell of said common bit line, coupled to said common bit line; and third circuitry for eliminating said leakage current from said read current to determine a cell current, coupled to said first and second circuitry.

15. The integrated circuit of claim 14 wherein said first circuitry applies approximately zero volts to a control gate of said flash memory cell.

16. The integrated circuit of claim 15 wherein said control gate is a portion of said common word line.

17. The integrated circuit of claim 14 comprising a floating gate as a storage element.

18. The integrated circuit of claim 14 comprising a nitride layer as a storage element.

* * * * *